United States Patent [19]

Joardar

[11] Patent Number: 5,467,057
[45] Date of Patent: Nov. 14, 1995

[54] CIRCUIT AND METHOD OF VARYING AMPLIFIER GAIN

[75] Inventor: Kuntal Joardar, Chandler, Ariz.

[73] Assignee: Motorola, Inc., Schaumburg, Ill.

[21] Appl. No.: 320,427

[22] Filed: Oct. 11, 1994

[51] Int. Cl.[6] .............................. H03F 3/45; H03G 3/30
[52] U.S. Cl. ...................... 330/254; 330/278; 330/307
[58] Field of Search .................................. 330/148, 254, 330/278, 279, 295, 307; 257/273

[56] References Cited

U.S. PATENT DOCUMENTS 3,322,970   5/1967   Batteau ................................ 330/295 X

OTHER PUBLICATIONS

Ayers et al., "PNP-Junction Field-Effect Transistor," *IBM Technical Disclosure Bulletin*, vol. 19, No. 3, Aug. 1976 pp. 984–985.

Primary Examiner—James B. Mullins
Attorney, Agent, or Firm—Robert D. Atkins

[57] ABSTRACT

A variable gain amplifier (10) provides a controllable amplification of an input signal as determined by a gate voltage. The variable gain amplifier takes on the form of a differential amplifier with first and second emitter-coupled lateral NPN bipolar transistors (12, 26) each having a gate (60) spanning the base region (48). The bases of the first and second transistors are biased with resistors (20–22, 30–32) coupled between $V_{cc}$ and ground potential. The gate voltage effects the conductivity through the base region and provides control over the forward current gain of the transistors. A third lateral NPN bipolar transistor (70) is added in parallel with the first transistor and operates with a separate gate voltage to provide two modes of amplification.

20 Claims, 2 Drawing Sheets

CIRCUIT AND METHOD OF VARYING AMPLIFIER GAIN

BACKGROUND OF THE INVENTION

The present invention relates in general to amplifier circuits and, more particularly, to a variable gain amplifier circuit.

Amplifiers are widely used in applications such as filters, radio transmitters and receivers, phase locked loops, anywhere it is necessary to amplify an input signal and provide an output signal having a greater or lesser amplitude. Many amplifiers have a fixed gain and provide a constant amplification over a predetermined frequency range of operation. Other applications require some external or dynamic control to set the appropriate amount of amplification for a given input signal.

Variable gain amplifiers are widely used in tunable filters, modulators/demodulators, etc. to provide real-time control over the signal amplification. Prior art variable gain amplifiers, for example those utilizing a Gilbert-gain cell, tend to be complex and consume a large amount of space on an integrated circuit. The Gilbert-gain cell includes two or more voltage-to-current conversion circuits operating in parallel followed by a multiplication stage. One input voltage acts as an amplification control over the other input voltage by way of the multiplication. The product of the currents is then converted back to a voltage that is subject to the variable amplification. The complexity of the prior art variable gain amplifiers tends to reduce its reliability in that a failure of any single component causes a general failure of the amplifier.

Hence, a need exists for a variable gain amplifier having reduced complexity so as to reduce costs and improve reliability.

DETAILED DESCRIPTION OF THE PREFERRED EMBODIMENT

Figure 1:
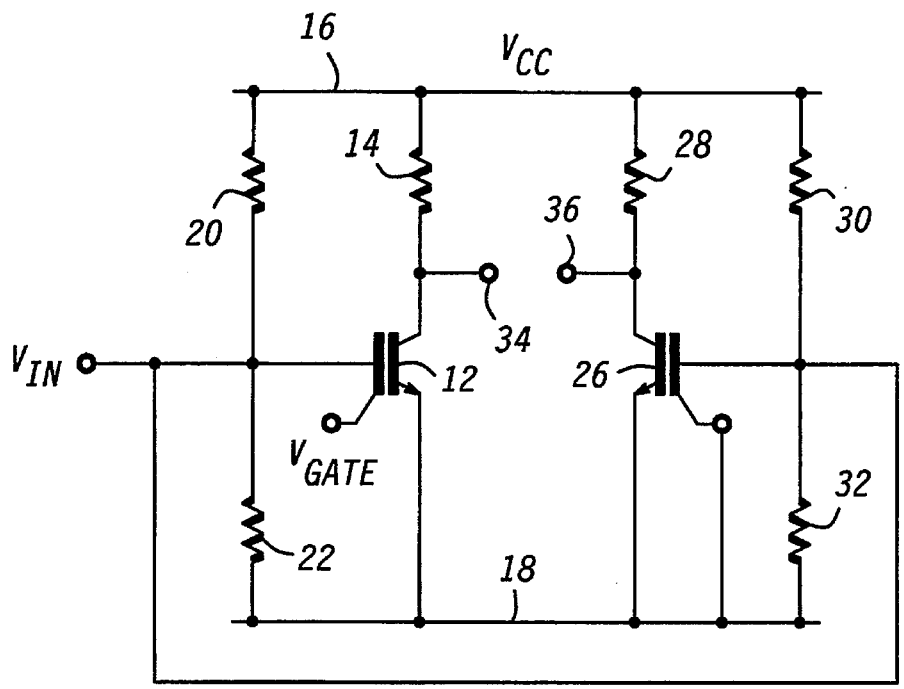
FIG. 1 illustrates a variable gain amplifier using differentially coupled transistors with independent base and gate biasing.

Referring to FIG. 1, a variable gain amplifier circuit 10 is shown suitable for manufacturing as an integrated circuit using conventional integrated circuit processes. Amplifier 10 includes a lateral NPN bipolar transistor 12 receiving at its base an analog input signal $V_{IN}$ operating up to 500.0 megahertz (MHz) with an amplitude of 200.0 millivolts. The collector of transistor 12 is coupled through resistor 14 to power supply conductor 16 operating at a positive power supply potential $V_{CC}$ such as 3.0 volts. The emitter of transistor 12 is coupled to power supply conductor 18 operating at ground potential. Transistor 12 further includes a gate terminal coupled for receiving an analog control signal $V_{GATE}$ also operating up to 500.0 megahertz with an amplitude of 200.0 millivolts. The base of transistor 12 is biased by the interconnection of resistors 20 and 22 serially coupled between power supply conductors 16 and 18. Resistors 20 and 22 are selected at 1.0 Kohms.

Amplifier 10 further includes a lateral NPN bipolar transistor 26 having a base that receives the input signal $V_{IN}$. The collector of transistor 26 is coupled by way of resistor 28 to power supply conductor 16 while the emitter is coupled to power supply conductor 18. The gate of transistor 26 is coupled to power supply conductor 18. Resistors 14 and 28 are matched with a value of $R_{14}=R_{28}=1.0$ Kohms. The base of transistor 26 is biased by the interconnection of resistors 30 and 32 serially coupled between power supply conductors 16 and 18. Resistors 30 and 32 are selected at 1.0 Kohms. The output of amplifier 10 may be taken differentially at nodes 34 and 36 at the collectors of transistor 12 and 26, respectively.

Figure 2:
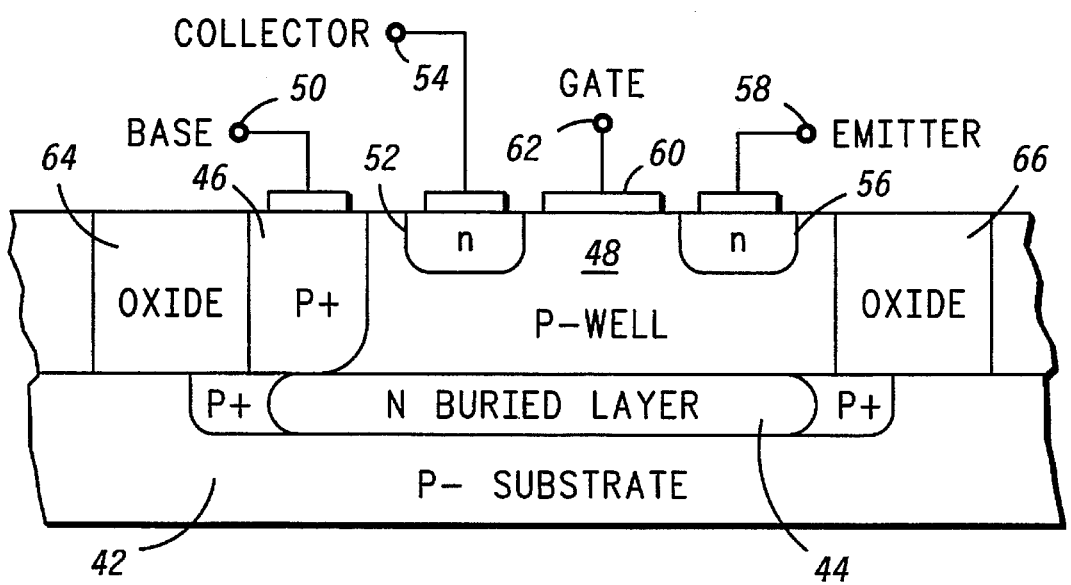
FIG. 2 illustrates a cross-sectional view of the lateral NPN transistors in FIG. 1.

Further detail of transistor 12 is shown in FIG. 2 as a lateral NPN bipolar transistor having a p-substrate 42 formed below n-buried layer 44. Transistor 26 follows a similar construction as described hereinafter for transistor 12. A region 46 composed of p+ conductivity material is formed adjacent to p-well 48 composed of a p-type conductivity material. A base contact 50 is connected to region 46 for good ohmic contact to p-well 48. A region 52 composed of n-type conductivity material is formed in p-well 48 and includes collector contact 54. Similarly, region 56 composed of n-type conductivity material is formed in p-well 48 with emitter contact 58. Thus, region 52 operates as the collector of lateral NPN bipolar transistor 12 while region 56 operates as the emitter and p-well 48 forms the base region. A gate 60 is formed above the base between region 52 and region 56 composed of a silicon dioxide layer adjacent to p-well 48 and a polysilicon layer to which gate contact 62 is connected. Oxide regions 64 and 66 surround lateral NPN transistor 12 as shown.

The operation of lateral NPN transistor 12 proceeds as follows. When a base voltage is applied to region 46, p-well 48 (base) becomes forward biased with respect to region 56 (emitter) causing n-type minority carries to flow into the base and form a conduction path from region 52 (collector) to region 56. A gate potential greater than the flatband voltage is simultaneously applied at gate contact 62 to generate additional n-type minority carriers between region 52 and region 56. The flatband voltage is that voltage required on gate 60 with respect to p-well region 48 to neutralize any charges induced in p-well region 48 due to the presence of gate 60. The gate potential may be 0.0 volts or more, while the flatband voltage is −0.7 volts. Thus, the gate potential enhances the supply of electrons from region 52 to region 56. In a lateral PNP configuration, the gate potential would be less than the flatband voltage.

The advantage of having simultaneous gate and base biasing is to facilitate the conduction between collector contact 54 and emitter contact 58. By selecting the proper gate bias, the collector current and forward current gain β may be chosen at a given bias setting independent of process and geometry.

Thus, using independent base biasing and gate biasing for lateral NPN bipolar transistor 12 results in variable forward current gain as a function of the gate voltage. The same technique may be applied to lateral PNP transistors. Another advantage of using simultaneous base biasing and gate biasing is a reduction in the overall area of transistor 12. The decrease in area requirement also reduces associated gate capacitance and improves the frequency performance of transistor 12.

The operation of amplifier 10 proceeds as follows. The normal amplification to a bipolar transistor is determined by the intrinsic forward current gain ($β_0$) of the transistor multiplied by the collector resistance ($R_C = R_{14} = R_{28}$) divided by the effective emitter resistance ($r_e$) as follows:

$$\text{GAIN} = \beta_0 \times \frac{R_C}{r_e} \quad (1)$$

As part of the present invention, transistors 12 and 26 are configured as a differential amplifier with each transistor having separate gate and base biasing. The differential amplifier may comprise NPN or PNP transistors. Transistor 12 receiving a gate voltage $V_{GATE}$ that causes variation in its forward current gain as described above. With the independent base and gate biasing, the gain of transistor 12 is shown in equation (2) as:

$$\text{GAIN}_{12} = (\beta_0 + K \times V_{GATE}) \times \frac{R_C}{r_e} \quad (2)$$

The constant K is determined by the gate oxide thickness and for example has a value of 200. Hence, the output voltage at nodes 34 and 36 ($V_{34}$ and $V_{36}$) is given as:

$$V_{34} = \text{GAIN}_{12} \times V_{IN} \quad (3)$$

$$V_{36} = \beta_0 \times \frac{R_C}{r_e} \times V_{IN}$$

$$V_{34} = \beta_0 \times \frac{R_C}{r_e} \times V_{IN} + K \times V_{GATE} \times \frac{R_C}{r_e} \times V_{IN}$$

where the gain of transistor 12 is controllable by the gate voltage $V_{GATE}$. Resistors $R_C$ and $r_e$ for transistor 26 is assumed equal to $R_C$ and $r_e$ for transistor 12. Transistors 12 and 26 have different gains such that the voltages $V_{34}$ and $V_{36}$ have differing amplitudes when $V_{GATE}$ is not equal to power supply conductor 18 as per equations (3). The different amplitudes as a function of gate voltage $V_{GATE}$ cause transistors 12 and 26 to operate differentially according to equation (4). With transistors 12 and 26 operating differentially, the differential output signal is given in equation (4) as:

$$V_{34} - V_{36} = K \times V_{GATE} \times \frac{R_C}{r_e} \times V_{IN} \quad (4)$$

Amplifier 10 thus provides variable gain as a function of the gate voltage $V_{GATE}$ according to equation (4). The variable gain amplifier also serves as a voltage multiplier by equation (4).

Figure 3:
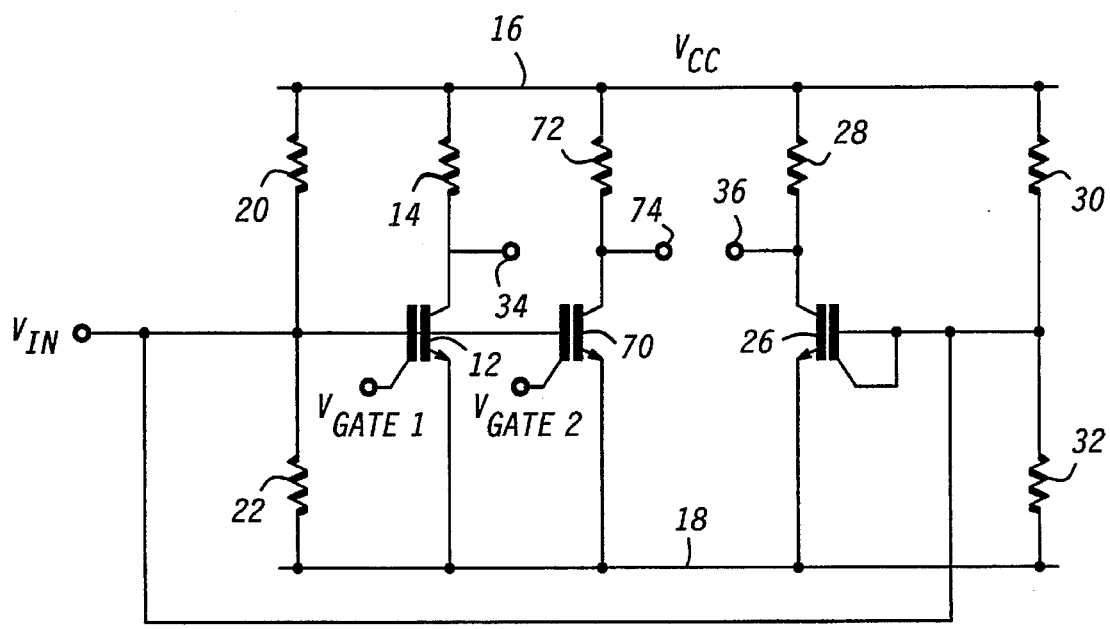
FIG. 3 illustrates an alternate embodiment of the variable gain amplifier.

In an alternate embodiment shown in FIG. 3, a third lateral NPN bipolar transistor 70 is added to the variable gain amplifier. Components having a similar function are assigned the same reference numbers used in FIG. 1. The gate of transistor 26 may be coupled to its base or to power supply conductor 18. Gate voltage $V_{GATE1}$ is the same as gate voltage $V_{GATE}$. Transistor 70 receives the analog input signal $V_{IN}$ at its base. The collector of transistor 70 is coupled through resistor 72 to power supply conductor 16. The emitter of transistor 70 is coupled to power supply conductor 18. Transistor 70 further includes a gate terminal such as described in FIG. 2 coupled for receiving an analog input signal $V_{GATE2}$ operating up to 500.0 megahertz with an amplitude of 200.0 millivolts. The base of transistor 70 is biased by the interconnection of resistors 20 and 22 serially coupled between power supply conductors 16 and 18.

Following the previous discussion, the differential voltage between nodes 34 and 36 is given as:

$$V_{34} - V_{36} = K \times V_{GATE1} \times \frac{R_C}{r_e} \times V_{IN} \quad (5)$$

Likewise, the differential voltage between nodes 74 and 36 with $R_{72} = R_C$ is given as $$V_{74} - V_{36} = K \times V_{GATE2} \times \frac{R_C}{r_e} \times V_{IN}. \quad (6)$$

The variable gain amplifier shown in FIG. 3 thus provides one variable amplification controlled by the gate voltage $V_{GATE1}$ as seen in equation (5) and another variable amplification controlled by the gate voltage $V_{GATE2}$ as seen in equation (6).

By now it should be appreciated that the present invention provides a controllable amplification as determined by a gate voltage. The variable gain amplifier takes on the form of a differential amplifier with lateral bipolar transistors having a gate oxide layer spanning the base region. The gate voltage effects the conductivity through the base region and provides control over the forward current gain of the transistors. The variable gain amplifier also serves as a voltage multiplier. The simple differential amplifier design provides increased reliability and lower costs.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A variable gain amplifier circuit, comprising:

a first transistor having a gate, a base, a collector and an emitter, said gate being coupled for receiving a first gate voltage, said base being coupled for receiving an input signal, said emitter being coupled to a first power supply conductor;

a first resistor coupled between a second power supply conductor and said collector of said first transistor;

a second transistor having a gate, a base, a collector and an emitter, said gate being coupled for receiving a second gate voltage, said base being coupled for receiving said input signal, said emitter being coupled to said first power supply conductor;

a second resistor coupled between said second power supply conductor and said collector of said second transistor; and said first and second transistors developing a differential output signal having a gain determined as a function of said first and second gate voltage.

2. The variable gain amplifier circuit of claim 1 wherein said first transistor includes:

a first well formed of a first conductivity type;

a first region formed of said first conductivity type adjacent to said first well and coupled for receiving said input signal through a base terminal;

a second region formed of a second conductivity type disposed in said first well and coupled to said collector of said first transistor;

a third region formed of said second conductivity type disposed in said first well that is separate from said second region and coupled to said emitter of said first transistor; and a first gate formed adjacent to said first well between said second and third regions and coupled for receiving said first gate voltage through a gate terminal.

3. The variable gain amplifier circuit of claim 2 wherein said second transistor includes:

a second well formed of said first conductivity type;

a fourth region formed of said first conductivity type adjacent to said second well and coupled for receiving said input signal through a base terminal;

a fifth region formed of said second conductivity type disposed in said second well and coupled to said collector of said second transistor;

a sixth region formed of said second conductivity type disposed in said second well that is separate from said fifth region and coupled to said emitter of said second transistor; and a second gate formed adjacent to said second well between said fifth and sixth regions and coupled for receiving said second gate voltage through a gate terminal.

4. The variable gain amplifier circuit of claim 3 further including:

a third resistor coupled between said first power supply conductor and said base of said first transistor; and a fourth resistor coupled between said second power supply conductor and said base of said first transistor.

5. The variable gain amplifier circuit of claim 4 further including:

a fifth resistor coupled between said first power supply conductor and said base of said second transistor; and a sixth resistor coupled between said second power supply conductor and said base of said second transistor.

6. The variable gain amplifier circuit of claim 5 wherein said gate of said second transistor is coupled to said first power supply conductor.

7. The variable gain amplifier circuit of claim 5 wherein said gate of said second transistor is coupled to said base of said second transistor.

8. The variable gain amplifier circuit of claim 1 further comprising:

a third transistor having a gate, a base, a collector and an emitter, said gate being coupled for receiving a third gate voltage, said base being coupled for receiving said input signal, said emitter being coupled to said first power supply conductor; and a third resistor coupled between said second power supply conductor and said collector of said third transistor for developing a differential output signal having a gain determined as a function of said third gate voltage.

9. The variable gain amplifier circuit of claim 8 wherein said third transistor includes:

a first well formed of a first conductivity type;

a first region formed of said first conductivity type adjacent to said first well and coupled for receiving said input signal through a base terminal;

a second region formed of a second conductivity type disposed in said first well and coupled to said collector of said third transistor;

a third region formed of said second conductivity type disposed in said first well that is separate from said second region and coupled to said emitter of said third transistor; and a first gate formed adjacent to said first well between said second and third regions and coupled for receiving said third gate voltage through a gate terminal.

10. A variable gain amplifier circuit, comprising:

a first transistor having a gate, a base, a collector and an emitter, said gate being coupled for receiving a first gate voltage, said base being coupled for receiving an input signal, said emitter being coupled to a first power supply conductor; and a second transistor having a gate, a base, a collector and an emitter, said gate being coupled for receiving a second gate voltage, said base being coupled for receiving said input signal, said emitter being coupled to said first power supply conductor, said collectors of said first and second transistors developing a differential output signal having a gain with respect to said input signal determined as a function of said first and second gate voltages.

11. The variable gain amplifier circuit of claim 10 further including:

a first resistor coupled between a second power supply conductor and said collector of said first transistor; and a second resistor coupled between said second power supply conductor and said collector of said second transistor.

12. The variable gain amplifier circuit of claim 11 wherein said first transistor includes:

a first well formed of a first conductivity type;

a first region formed of said first conductivity type adjacent to said first well and coupled for receiving said input signal through a base terminal;

a second region formed of a second conductivity type disposed in said first well and coupled to said collector of said first transistor;

a third region formed of said second conductivity type disposed in said first well that is separate from said second region and coupled to said emitter of said first transistor; and a first gate formed adjacent to said first well between said second and third regions and coupled for receiving said first gate voltage through a gate terminal.

13. The variable gain amplifier circuit of claim 12 wherein said second transistor includes:

a second well formed of said first conductivity type;

a fourth region formed of said first conductivity type adjacent to said second well and coupled for receiving said input signal through a base terminal;

a fifth region formed of said second conductivity type disposed in said second well and coupled to said collector of said second transistor;

a sixth region formed of said second conductivity type disposed in said second well that is separate from said fifth region and coupled to said emitter of said second transistor; and a second gate formed adjacent to said second well between said fifth and sixth regions and coupled for receiving said second gate voltage through a gate terminal.

14. The variable gain amplifier circuit of claim 13 further including:

a third resistor coupled between said first power supply conductor and said base of said first transistor; and a fourth resistor coupled between said second power supply conductor and said base of said first transistor.

15. The variable gain amplifier circuit of claim 14 further including:

a fifth resistor coupled between said first power supply conductor and said base of said second transistor; and a sixth resistor coupled between said second power supply conductor and said base of said second transistor.

16. The variable gain amplifier circuit of claim 15 wherein said gate of said second transistor is coupled to said first power supply conductor.

17. The variable gain amplifier circuit of claim 15 wherein said gate of said second transistor is coupled to said base of said second transistor.

18. The variable gain amplifier circuit of claim 11 further comprising:

a third transistor having a gate, a base, a collector and an emitter, said gate being coupled for receiving a third gate voltage, said base being coupled for receiving said input signal, said emitter being coupled to said first power supply conductor; and a third resistor coupled between said second power supply conductor and said collector of said third transistor for developing a differential output signal having a gain determined as a function of said third gate voltage.

19. The variable gain amplifier circuit of claim 18 wherein said third transistor includes:

a first well formed of a first conductivity type;

a first region formed of said first conductivity type adjacent to said first well and coupled for receiving said input signal through a base terminal;

a second region formed of a second conductivity type disposed in said first well and coupled to said collector of said third transistor;

a third region formed of said second conductivity type disposed in said first well that is separate from said second region and coupled to said emitter of said third transistor; and a first gate formed adjacent to said first well between said second and third regions and coupled for receiving said third gate voltage through a gate terminal.

20. A method of varying gain in an amplifier circuit, comprising the steps of:

applying an input signal to bases of first and second transistors that are differentially coupled;

applying a first gate voltage to a gate of said first transistor;

applying a second gate voltage to a gate of said second transistor;

varying said first gate voltage to alter forward current gain of said first transistor; and developing a differential output signal at collectors of said first and second transistors having a gain with respect to said input signal determined as a function of said first and second gate voltages.

* * * * *

UNITED STATES PATENT AND TRADEMARK OFFICE
CERTIFICATE OF CORRECTION

PATENT NO. : 5,467,057
DATED : November 14, 1995
INVENTOR(S) : Kuntal Joardar

It is certified that error appears in the above-indentified patent and that said Letters Patent is hereby corrected as shown below:

In column 4, line 52, claim 1, delete "voltage" and insert therefor --voltages--.

Signed and Sealed this

Twenty-third Day of July, 1996

*Attest:*

BRUCE LEHMAN

*Attesting Officer*  *Commissioner of Patents and Trademarks*